(12) United States Patent
Nayak et al.

(10) Patent No.: US 9,941,329 B2
(45) Date of Patent: Apr. 10, 2018

(54) LIGHT EMITTING DIODES (LEDS) WITH INTEGRATED CMOS CIRCUITS

(71) Applicant: GLOBALFOUNDRIES INC., Grand Cayman (KY)

(72) Inventors: Deepak Nayak, Union City, CA (US); Srinivasa Banna, San Jose, CA (US); Ajey P. Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/599,438

(22) Filed: May 18, 2017

(65) Prior Publication Data

US 2017/0338276 A1    Nov. 23, 2017

Related U.S. Application Data

(60) Provisional application No. 62/337,904, filed on May 18, 2016.

(51) Int. Cl.
| | |
|---|---|
| *H01L 21/00* | (2006.01) |
| *H01L 27/15* | (2006.01) |
| *H01L 33/06* | (2010.01) |
| *H01L 33/00* | (2010.01) |
| *H01L 33/24* | (2010.01) |
| *H01L 23/48* | (2006.01) |

(52) U.S. Cl.
CPC .......... *H01L 27/156* (2013.01); *H01L 23/481* (2013.01); *H01L 33/0029* (2013.01); *H01L 33/06* (2013.01); *H01L 33/24* (2013.01); *H01L 2933/0066* (2013.01)

(58) Field of Classification Search
None
See application file for complete search history.

(56) References Cited

U.S. PATENT DOCUMENTS

| 8,241,932 B1 * | 8/2012 | Yu ....................... H01L 25/0753 257/E21.122 |
| 2014/0191249 A1 * | 7/2014 | Blanchard ............. H01L 27/153 257/77 |
| 2014/0206117 A1 * | 7/2014 | Sonoda ............... H01L 51/0023 438/29 |
| 2014/0368772 A1 * | 12/2014 | Hwang ............. G02F 1/133502 349/106 |
| 2014/0374742 A1 * | 12/2014 | Tsang ................... H01L 25/167 257/43 |

(Continued)

*Primary Examiner* — Angel Roman
(74) *Attorney, Agent, or Firm* — Horizon IP Pte Ltd.

(57) ABSTRACT

Disclosed is a multi-color semiconductor LED display with integrated with CMOS circuit components, such as thin film transistors (TFTs). LEDs of the display are disposed on a first major surface of a substrate while CMOS circuit components which are configured as circuitry for operating the display are disposed on a second opposing major surface of the substrate. The CMOS components and LEDs are coupled by through silicon via (TSV) contacts through the substrate. Integrating CMOS components with LED on one substrate enhances compactness of the display. Other advantages include low power and low cost with high brightness and resolution desired for portable applications, including virtual reality and augmented reality applications.

20 Claims, 13 Drawing Sheets

(56) References Cited

U.S. PATENT DOCUMENTS

2015/0295013 A1* 10/2015 Matsumoto ........... H01L 27/322
                                                     257/40
2016/0164033 A1*  6/2016 Moon ................ H01L 51/5253
                                                     257/40

* cited by examiner

LIGHT EMITTING DIODES (LEDS) WITH INTEGRATED CMOS CIRCUITS

CROSS-REFERENCE TO RELATED APPLICATIONS

This application claims the priority of U.S. Provisional Application No. 62/337,904, entitled "Integration of semiconductor LED with Si integrated circuits and TFTs" filed on May 18, 2016. In addition, this application is concurrently filed with and cross-references to U.S. patent application titled "INTEGRATED SMART DISPLAY SYSTEM WITH MULTI-COLOR LIGHT EMITTING DIODES (LEDs)" Ser. No. 15/599,465 which claims the priority of U.S. Provisional Application No. 62/337,898, entitled "Smart display system and method of forming there of" filed on May 18, 2016; and further filed with and cross-references to U.S. patent application titled "LIGHT EMITTING DIODES (LEDs) WITH STACKED MULTI-COLOR PIXELS FOR DISPLAYS" Ser. No. 15/599,427 which claims the priority of U.S. Provisional Application No. 62/337,900, entitled "3 Color stacked RGB pixel using Fin and Nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/337,902, entitled "Vertically stacked RGB LED pixel for smart display" filed on May 18, 2016; and U.S. patent application titled "LEDs WITH THREE COLOR RGB PIXELS FOR DISPLAYS" Ser. No. 15/599,458 which claims the priority of U.S. Provisional Application No. 62/337,901, entitled "Three-Color RGB pixel using m-plane nanowire LEDs for smart displays" filed on May 18, 2016; U.S. Provisional Application No. 62/337,899, entitled "Method of Forming GaN MQW FIN Structures for LED Displays" filed on May 18, 2016; and U.S. Provisional Application No. 62/355,895, entitled "3 Color RGB pixel using fin LEDs for smart displays" filed on May 18, 2016. All disclosures are incorporated herewith by reference in their entireties for all purposes.

BACKGROUND

Light emitting diodes (LEDs) are widely used for various color display technologies, including televisions, smart phones and computer monitors. For portable applications, there is a need or demand for low cost, low power, high brightness and high resolution display pixel technology. Such requirement is particularly apparent for portable and small form factor displays, such as smart phones and head mount display devices which are used in virtual reality (VR) and augmented reality (AR) applications.

To form color displays, 3 primary colors are needed. The three primary colors are red, green and blue. However, conventional color displays using red, green and blue LEDs are complex, leading to high manufacturing cost. For example, conventional color displays employ different materials or components for different color LEDs, including color phosphors, color filters and down convertors. In addition, conventional displays have LEDs which are formed on a different substrate than circuit components, such as complementary metal oxide semiconductor (CMOS) circuit components. As such, conventional color displays are not conducive to high resolution and compactness desired in VR and AR applications.

The present disclosure is directed to cost effective and high resolution color LED displays with integrated CMOS circuitry.

SUMMARY

A device is disclosed. In one embodiment, the device includes a substrate having first and second major substrate surfaces. The first substrate surface includes multiple quantum well (MQW) LEDs configured to form RGB pixels of a display, wherein a RGB pixel includes a red (R) MQW LED, a green (G) MQW LED and a blue (B) MQW LED, wherein a MQW LED includes an anode terminal and a cathode terminal. Complementary metal oxide semiconductor (CMOS) components are disposed on the second substrate surface. The CMOS components include low temperature CMOS components which avoid damaging the MQW LEDs on the first surface. The device further includes a CMOS back-end-of-line (BEOL) dielectric with a plurality of ILD layers to provide interconnections to the CMOS components. Through silicon via (TSV) contacts extend through the surfaces of the substrate. The TSV contacts interconnect the LED terminals on the first surface of the substrate to the CMOS components on the second substrate surface and interconnect the external pad connections on the surface of the BEOL dielectric.

In another embodiment, a method of forming a device is disclosed. The method includes providing a substrate comprising first and second opposing major surfaces. MQW LEDs are formed on the first major surface of the substrate and configured as a multi-color LED display. CMOS components are formed on the second major surface of the substrate using front-end-of-line (FEOL) processing. Back-end-of-line (BEOL) dielectric is then formed over the CMOS components using BEOL processing. The BEOL dielectric includes a plurality of interlevel dielectric (ILD) levels, wherein an ILD level includes a via dielectric layer with contacts, a metal dielectric layer with metal lines, and wherein the BEOL dielectric provides interconnections for the CMOS components. The method further includes forming through silicon via (TSV) contacts which extend through the second substrate surface and connect to the LED terminals of the LED on the first substrate surface, wherein the TSV contacts provide interconnections between the CMOS components and LEDs.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2l show simplified cross-sectional views of a process for forming a device.

DETAILED DESCRIPTION

Embodiments generally relate to semiconductor devices. More particularly, embodiments relate to semiconductor devices having light emitting diodes (LEDs) with three-color pixels. In one embodiment, the three-color LEDs are disposed on the same substrate or wafer with CMOS circuit components. The LEDs may be used in high brightness and high resolution color displays, including wearable devices and head mount display devices, such as those employed in virtual reality (VR) or augmented reality (AR) applications. The LEDs may also be used in other applications.

Figure 1:
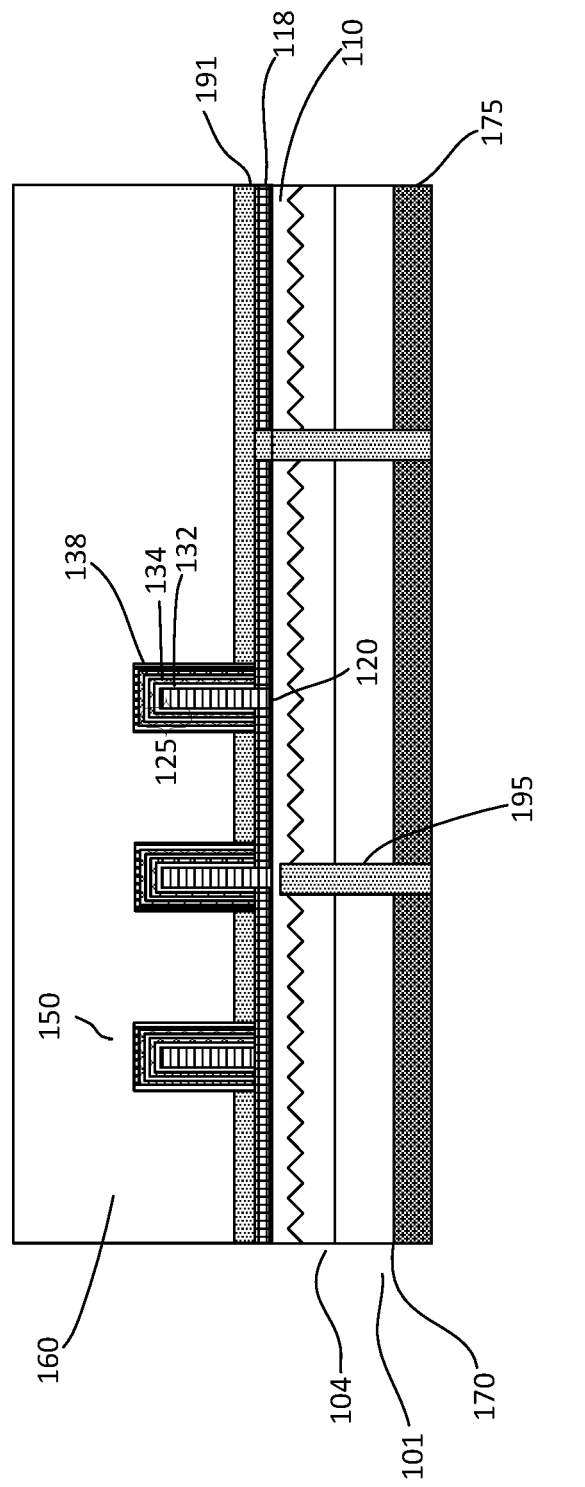
FIG. 1 shows a simplified cross-sectional view of an embodiment of a device.

FIG. 1 shows a simplified cross-section view of an embodiment of a portion of a device 100. The device, for example, includes LEDs integrated with CMOS components. As shown, the device includes a substrate 101. The substrate includes first and second major surfaces. The first major surface may be referred to as the LED surface and the second major surface may be referred to as the CMOS surface. The first surface includes an LED region in which LEDs are formed. The first surface may include other non-LED regions. As for the second surface, it includes CMOS components, such as CMOS thin film transistors (TFTs).

The substrate may be a bulk semiconductor substrate, such as a silicon (Si) substrate. The substrate, for example, may have a thickness of about 10-100 um. The thickness, in one embodiment, is a final substrate thickness. The initial thickness of the substrate may be thicker. For example, the substrate may have an initial thickness of 500-800 um and thinned to the final substrate thickness. The substrate may have other initial and final thicknesses.

Alternatively, the substrate may be a crystal-on-insulator (COI) substrate. A COI substrate includes a thin surface substrate and a bulk substrate separated by an insulator layer, such as buried oxide layer (BOX). In the case of a COI substrate, the bulk substrate which includes the second major surface is a silicon bulk. The COI substrate may have an initial thickness of 500-800 um. As for the surface substrate which includes the first major surface, it may be silicon or other types of surface substrates. For example, the surface substrate may be a silicon carbide (SiC) or a sapphire substrate.

The substrate may be a silicon substrate with a (111) crystal orientation (Si(111)). A Si(111) oriented substrate a surface plane with a (111) crystal orientation. In alternative embodiments, the silicon substrate may have a (100) crystal orientation (Si(100)). A Si(100) oriented substrate has a surface plane with a (100) crystal orientation. In the case of a Si(100) substrate, the first major surface is processed to form V-grooves 106 to expose the (111) crystal orientation. For example, the first major surface of a Si(100) substrate may be processed to transform it to be a Si(111) substrate. In one embodiment, the grooves are formed in the LED region of a Si(100) substrate. Non-LED regions of the substrate need not have the grooves. The grooves may be continuous grooves. In other embodiments, the grooves may be discontinuous grooves. A groove or grooves may be selectively provided under an LED in the LED region.

The substrate may include a doped device well 104. The doped well, for example, extends from the first or top surface of the substrate to a depth of about 0.5 um. Other depths may also be useful. The doped device well may be heavily doped with first polarity type dopants. In one embodiment, the doped device well is a heavily doped n-type ($n^+$) device well. Alternatively, the device well may be a heavily doped p-type ($p^+$) device. The dopant concentration of the heavily doped device well may be about $10^{20}$ atoms/cm$^3$. Other dopant concentrations for the heavily doped device well may also be useful. The dopant concentration may depend on, for example, the technology node.

A base layer 110 may be disposed on the first major surface of the substrate. The base layer may be a composite base layer having multiple layers. In one embodiment, the base layer includes a first base or nucleation layer and a second base or buffer layer. The nucleation layer is disposed on the substrate and the buffer layer is disposed on the nucleation layer. The nucleation layer facilitates in forming the buffer layer on the substrate. In one embodiment, the nucleation layer facilitates in growing a buffer layer with a wurtzite crystal structure.

The nucleation layer may be an aluminum nitride (AlN) layer and the buffer layer may be a gallium nitride (GaN) layer. Other types of nucleation layers which facilitates growing a buffer layer with a wurtzite crystal structure, such as GaN, or other types of buffer layers with a wurtzite crystal structure may also be useful. The thickness of the nucleation layer may be about 50-200 nm while the buffer layer may be about 0.5-2 um. Other thicknesses for the nucleation and buffer layers may also be useful. In the case of grooves on the top surface of the substrate, the base layer may be planarized to form a planar surface. This results in the second base layer having a planar top surface. Alternatively, the second base layer is planarized to form a planar top surface.

The top surface of the substrate includes LEDs 150 in the LED region. The LEDs are configured to form multi-color LED pixels. A multi-color pixel, for example, includes a red (R) LED, a green (G) LED and a blue (B) LED. In some embodiments, a multi-color pixel may include a plurality of R LEDs, G LEDs and B LEDs. Numerous multi-color LED pixels are configured to form a display.

Although 3 LEDs are shown in the portion of the device, it is understood that the device includes many more LEDs. The LEDs are configured to form multi-color LED pixels. A multi-color pixel, for example, includes a red (R) LED, a green (G) LED and a blue (B) LED. In some embodiments, a multi-color pixel may include a plurality of R LEDs, G LEDs and B LEDs. Numerous multi-color LED pixels are configured to form a display.

The LEDs, in one embodiment, are multiple quantum well (MQW) LEDs. Other types of LEDs may also be useful. A MQW LED includes a MQW 125 disposed on an LED base. The base may be, for example, LED body 120. The base layer may be a GaN base layer. The base layer, in one embodiment, is a first polarity type base layer, such as a n-doped base layer. The base layer in one embodiment, is a n-doped GaN (n-GaN) base layer. Providing a p-doped GaN (p-GaN) may also be useful. The base layer may be a medium doped based layer. For example, the dopant concentration of the base layer may be about $1E^{18}$ atoms/cm$^3$. The base layer serves as a first terminal of a MQW LED. In the case of a n-doped base layer, it serves as a cathode terminal of the MQW. Alternatively, a p-doped base layer serves as an anode terminal of the MQW LED.

The doped device well, as discussed, is the same polarity type as the body. The doped well may be a common first terminal of the LEDs. Preferably, the common first terminal is a common cathode terminal. The doped well may facilitate current spreading by serving as a common first terminal of the LEDs of the device. In addition, the doped device well provides a low resistance connection to the first terminal of the LEDs. The doped device well may also serve other purposes.

As for the MQW, it includes y quantum wells (QWs), where y is ≥2. The MQW may include about 2-6 QWs. In one embodiment, a MQW includes two QWs. Other number of QWs may also be useful. The number of QWs may depend on, for example, the desirable optical efficiency. A quantum well includes a well layer 132 sandwiched by barrier layers 134. The barrier layer may be served by a barrier layer from a previous or subsequent QW or by an LED base layer 131.

In one embodiment, the well layer of a QW includes an indium gallium nitride (InGaN) layer and a barrier layer includes a GaN layer. The layers of the MQW may be formed by SEG. The GaN barrier layer may be an undoped layer or a layer doped with first polarity type dopants. The thickness of the well layer may be about 3 nm while the thickness of the barrier layer is about 12 nm. Other thicknesses may also be useful. For example, in the case where the barrier layer is served by the body or top LED layer, the thickness of the barrier layer may be thicker. Other configurations of the well and barrier layers may also be useful.

A top LED layer 138 may be disposed over the MQW. Disposed between the top LED layer and MQW is an electron blocking layer. The blocking layer, for example, may be an aluminum gallium nitride (AlGaN) layer. Other types of blocking layers may also be useful. The top LED layer may be a second polarity type doped top LED layer, such as a p-doped top LED layer. In one embodiment, the top LED layer is a second polarity type GaN layer. For example, the top LED layer may be a p-GaN layer. The top LED layer serves as a second terminal of a MQW LED. In the case of a p-doped top LED layer, it serves as an anode terminal of the MQW LED. Alternatively, a n-doped top LED layer serves as a cathode terminal of the MQW LED.

The multi-color MQW LED pixels, in one embodiment, includes multi-color MQW LEDs. For example, the MQW LEDs may be non-stacked fin-type or nanowire multi-color MQW LEDs, as described in "LEDs WITH THREE COLOR RGB PIXELS FOR DISPLAYS" Ser. No. 15/599,458, which is already herein incorporated by reference. The MQW LEDs, in other embodiments, may be overlapping or non-overlapping stacked fin-type or nanowire multi-color MQW LEDs, as described in "LIGHT EMITTING DIODES (LEDs) WITH STACKED THREE COLOR RGB PIXELS FOR DISPLAYS" Ser. No. 15/599,427, which is already herein incorporated by reference for all purposes.

As shown, the MQW LEDs may be unstacked fin-type or nanowire MQW LEDs. In the case of fin-type nanowire LEDs, first polarity type doped GaN fin bodies 120 are provided on the substrate. For example, n-GaN fin bodies are provided on the substrate. The fin bodies are formed on the substrate surface exposed by a body mask layer 118. The body mask may be a silicon nitride mask layer with openings which exposes the base layer on the substrate for forming the fin bodies.

A fin body is an elongated member of an LED pixel. The elongated member may be disposed along a first direction of the substrate. The height of the fin body may be about 1 um and a length of the fin body in the row direction may be about 5 um. Other dimensions for the fin body may also be useful. The first direction, for example, may be referred to as a row direction. For example, a fin body is disposed along the row direction. In the case of (100) silicon substrate with grooves, the fin body is disposed in the direction of the V-grooves. For example, the V-grooves 106 and the fin body are disposed along the row direction. A fin may serve as a common fin for pixels of the display in the row direction. Other configurations of fins may also be useful.

A fin body may include R, G and B LEDs of a pixel. The R, G and B LEDs are disposed on a fin body and separated from each other. The G LED is disposed between the R and B LED on the fin body. A metal layer 191 is disposed on the substrate over the mask layer. The metal layer may represent an LED metal level, such as LM or LM1. The metal layer may include, in one embodiment, a high temperature metal layer. For example, the metal layer can sustain high process temperatures. In one embodiment, the metal layer can sustain temperatures up to 750° C. High temperature metals include, for example, titanium (Ti) or tungsten (W). Other types of high temperature metal layers may also be used. The metal layer may have a thickness of about 0.25 um. Other thicknesses may also be useful. The metal line may be a patterned metal layer which includes multiple metal lines connecting the same color LEDs of a pixel in a column direction. As shown, a metal line is a planar metal line contacting the top LED layers at sides of the lower portion of the LEDs. For example, the metal line does not conformally cover the LEDs.

The different color LEDs have different bandgaps. In one embodiment, the different bandgaps for different color LEDs are achieved by varying the percentage of indium (In) in the well layers of the MQW. In one embodiment, the percentage of In of the InGaN layer of the well layers of the MQW is varied to achieve different bandgaps for different color LEDs. For example, x defines the percentage (atomic percent) of In in the $In_xGa_{1-x}N$ well layer. In one embodiment, the percentage of In for the $In_xGa_{1-x}N$ layer in the MQW may be as follows:

Blue: x=15-20%;
Green: x=25-30%; and
Red: x=35-40%.

Other percentages of In may be useful, as long as the different bandgaps have sufficient separation. For example, different percentages of In results in different QW bandgaps which emit different wavelength of light.

In one embodiment, the base layer for the different color LEDs have different widths. For example, in the case where the fin includes multiple color LEDs, the fin portion of the different color LEDs have different widths. The different widths facilitate having different percentages of In in the well layers of the MQW. The well layers with higher In percentage is facilitated with a wider base portion. In one embodiment, the width of the base portion for the R LED is less than about 100 nm, the width of the base portion for the G LED is about 200 nm while the width of the base portion of the B LED is greater than about 300 nm. In other embodiments, the width of the base portion for the R LED may be 25-125 nm, the width of the base portion for the G LED may be 150-250 nm while the width of the base portion of the B LED may be 300-400 nm. Other widths for different base portions or base layers may also be useful.

In other embodiments, the LEDs may be nanowire LEDs. For a nanowire LED, the LED base is a nanowire body 120. The nanowire body may be an elongated member having a circular cross-sectional shape disposed on the substrate. Providing other cross-sectional shaped nanowire bodies may also be useful. The nanowire body extends from the substrate in a direction perpendicular to its surface. The nanowire body may have a height sufficient to accommodate the LED base. In one embodiment, the nanowire body has a height of about 1 um and a diameter of about 200 nm. Other nanowire body dimensions may also be useful. In one embodiment, the side of the nanowire body extending from the substrate surface may be along a m-plane while the top of the body may be along a c-plane. Other configurations of nanowire bodies may also be useful.

A MQW is disposed on the nanowire. A top LED layer may be disposed over the MQW separated by an electron blocking layer. In the case of nanowire LEDs, a plurality of same color LEDs may be configured to form a module of a pixel. The pixel includes a R LED module, a G LED module and a B LED module. LEDs of a module are connected by a metal layer. For example, the metal layer may be patterned to form a metal plate for each module which commonly coupled the LEDs of the module.

The different color LEDs have different bandgaps. In one embodiment, the different bandgaps for different color LEDs are achieved by varying the percentage of indium (In) in the well layers of the MQW. In one embodiment, the percentage of In of the InGaN layer of the well layers of the MQW is varied to achieve different bandgaps for different color LEDs. For example, x defines the percentage (atomic percent) of In in the $In_xGa_{1-x}N$ well layer. In one embodiment, the percentage of In for the $In_xGa_{1-x}N$ layer in the MQW may be as follows:

Blue: x=15-20%;
Green: x=25-30%; and
Red: x=35-40%.

Other percentages of In may be useful, as long as the different bandgaps have sufficient separation. For example, different percentages of In results in different QW bandgaps which emit different wavelength of light.

In one embodiment, the base layer for the different color LEDs have different widths. For example, in the case where the nanowire LEDs, the nanowire bases for the different color LEDs have different widths. The different widths facilitate having different percentage of In in the well layers of the MQW. The well layers with higher In percentage is facilitated with a narrower base. In one embodiment, the width of the base portion for the R LED is less than about 100 nm, the width of the base portion for the G LED is about 200 nm while the width of the base portion of the B LED is greater than about 300 nm. In other embodiments, the width of the base portion for the R LED may be 25-125 nm, the width of the base portion for the G LED may be 150-250 nm while the width of the base portion of the B LED may be 300-400 nm. Other widths for different nanowire bases may also be useful.

In one embodiment, disposed on the second major surface of the substrate are CMOS components 170. The CMOS components include CMOS transistors, such as TFTs. A TFT may be disposed in a transistor region. The transistor region may be isolated from other component regions by a shallow trench isolation (STI) region. The STI region, for example, surrounds the transistor region. A transistor well is disposed in the transistor region. The transistor well includes second polarity type dopants for a first polarity type transistor. For example, a p-well is provided for a n-type transistor. The transistor includes a gate disposed on the substrate surface and first and second source/drain (S/D) regions on first and second sides of the gate. The gate includes a gate electrode over a gate dielectric. The S/D regions are first polarity type doped regions, corresponding to a first polarity type device. The CMOS transistors include both n-type and p-type transistors. The CMOS transistors, including wells and STIs, may be referred to as front-end-of-line (FEOL) components. The FEOL components may be configured to include various digital circuits such as row/column decoders, pixel driver circuits, pixel correction circuits and HDMI/LDVS interface circuits. Other types of FEOL components or circuits may also be useful.

In one embodiment, the FEOL CMOS components are low temperature CMOS components. For example, the FEOL CMOS components have less than about 750° C. process temperatures.

In one embodiment, low temperature STIs include low temperature plasma deposited dense oxide. The process temperature of the dense oxide is less than 700° C. The deposited oxide may be densified by a rapid thermal anneal (RTA), a dynamic surface anneal (DSA), a laser surface anneal (LSA) or a combination thereof. The densification may be achieved in a short time. With respect to DSA and LSA, the densification is also achieved with spatially localized effect.

In some embodiments, the S/D regions may be raised source drain regions. Raised S/D regions include epitaxial layers, such as silicon (Si) or silicon germanium (SiGe) epitaxial layers. For Si epitaxial layers, the process temperature is less than 750° C. while SiGe epitaxial layers have a process temperature of less than 650° C. Dopant activation of dopants of the wells and S/D regions as well as other doped regions may be achieved by LSA, DSA or far-infrared laser activation. Dopant activation is achieved in a short time with spatially localized effect.

A back-end-of-line (BEOL) dielectric 175 is disposed over the FEOL components. The BEOL dielectric includes a plurality of interlevel dielectric (ILD) layers. An ILD layer includes a contact level with via contacts and metal level with metal lines. An ILD layer may be formed using various BEOL processes. For example, single damascene, dual damascene, and/or reactive ion etch techniques may be employed. Other techniques may also be employed to form ILD layers of the BEOL dielectric. The contacts may be W or copper contacts while the metal lines may be copper lines. Other types of contacts and metal lines may also be useful. The contacts and metal lines of a metal level may be of the same type of conductive material or of different types of materials. The BEOL dielectric are processed at a temperature which is lower than the FEOL temperatures.

In one embodiment, through silicon via (TSV) contacts 195 are provided. The TSV contacts extend through the surfaces of the substrate to provide electrical connections between the LEDs on the first major surface of the substrate and the CMOS components on the second major surface of the substrate. A TSV contact includes a conductive contact disposed in a TSV formed in the substrate. The TSV contact may be a Cu contact. The conductive contact, in one embodiment, includes an isolation collar surrounding it. The isolation collar may be an oxide collar.

The TSVs extends through the first major surface of the substrate to connect to contact regions of the LEDs. For example, TSVs are coupled to first and second terminals of the LEDs of the display. As shown, the TSV contact to the first terminal may extend to the base layer while the TSV contact to the second terminal is coupled to the first metal layer.

As shown, the TSV contacts extends through the second surface of the substrate to the surface of the BEOL dielectric. For example, the TSV contacts at the surface of the BEOL dielectric may serve as pads for external connection to the device. The TSV contacts may be formed after BEOL processing. For example, TSV openings are formed through the BEOL dielectric and substrate. Forming TSV contacts at other points in the process flow may also be useful. In some cases, BEOL dielectric may provide extensions of the TSV contacts to the surface of the BEOL dielectric. Other configurations of TSV contacts may also be useful. The BEOL dielectric may include pad layer with pad contacts for external connection and a redistribution layer which couples the TSV contacts to the pads. Although only two TSV contacts are shown, it is understood that the device may include numerous TSV contacts connected to the first and second terminals of the LEDs. For example, first TSV contacts are coupled to first LED terminals and second LED contacts are coupled to second LED terminals. Other TSV contacts may be provided to other terminals or contact regions for components on the first major surface of the substrate.

As described, the low temperature CMOS components enable integration on the same substrate as the LEDs. For example, the low temperature CMOS components on the second major surface of the substrate avoid damaging the LEDs on the first major surface of the substrate. Integrating the CMOS components on the same substrate with the LEDs reduces costs and facilitates compactness for displays.

FIGS. 2a-2l show simplified cross-sectional views of an embodiment of a process for forming a device 200. The device, for example, is similar to that described in FIG. 1. Common elements may not be described or described in detail. In one embodiment, the process describes forming a multi-color LED display with integrated CMOS components.

Figure 2A:
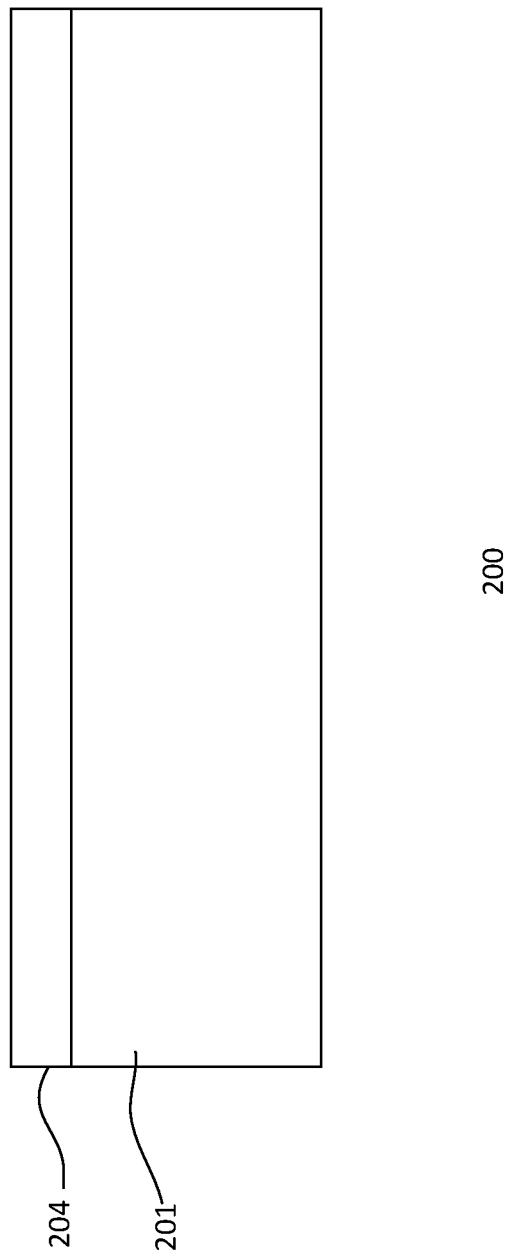

Referring to FIG. 2a, a substrate 201 is provided. The substrate includes first and second major surfaces. The substrate may be a bulk semiconductor substrate, such as a Si substrate. The substrate, for example, may have a thickness of about 500-800 um. The substrate may be Si(111) substrate. In alternative embodiments, the silicon substrate may be a Si(100). A Si(100) oriented substrate has a surface plane with a (100) crystal orientation.

Alternatively, the substrate may be a crystal-on-insulator (COI) substrate. A COI substrate includes a thin surface substrate and a bulk substrate separated by an insulator layer, such as buried oxide layer (BOX). In the case of a COI substrate, the bulk substrate which includes the second major surface is a silicon bulk. As for the surface substrate which includes the first major surface, it may be silicon or other types of surface substrates. For example, the surface substrate may be a silicon carbide (SiC) or a sapphire substrate.

Although the cross-sectional view only shows a portion of a device for simplification purposes, it is understood that the substrate may be a wafer on which a plurality of devices are formed. For example, the substrate is a wafer which is processed to form a plurality of devices in parallel. After the devices are formed, the wafer is diced to singulate the devices.

In one embodiment, the substrate is prepared with a device well 204. The device well is a doped well. The doped well, for example, extends from the surface of the substrate to a depth of about 0.5 nm. The doped device well may be heavily doped with first polarity type dopants. In one embodiment, the doped device well is a heavily doped n-type (n$^+$) device well. The device well may be formed by implanting first polarity type dopants. An implant mask may be employed. For example, the implant mask exposed the regions in which dopants are to be implanted. Alternatively, the implant may be a blanket implant performed without an implant mask. An anneal is performed after forming the device wells. The anneal activates the dopants.

Figure 2B:
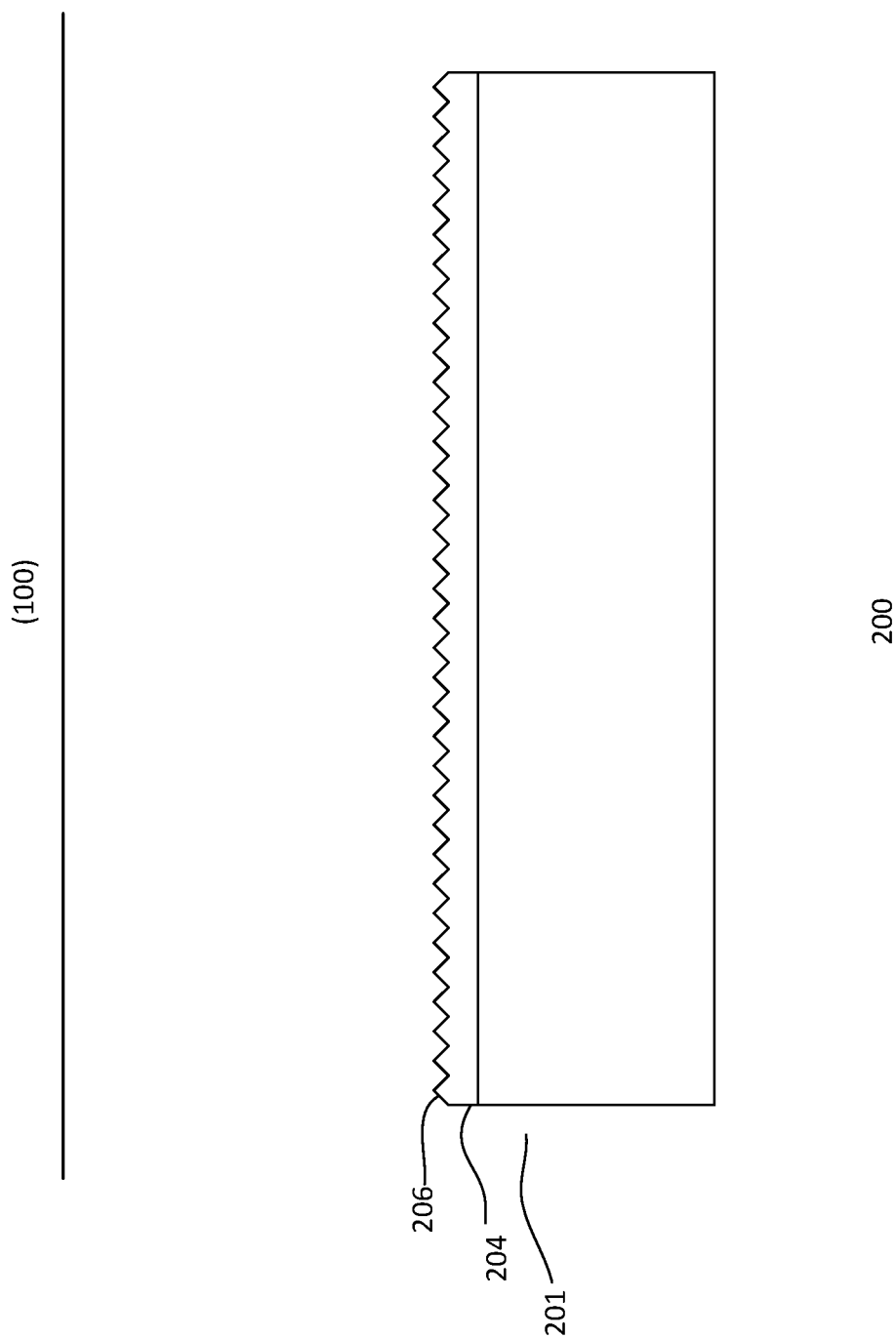

In the case of a Si(100) substrate, as shown in FIG. 2b, it may be processed to form V-grooves 206 to expose the (111) surface in the Si(100) substrate. The V-grooves may be formed by an anisotropic etch, such as a wet etch. The anisotropic etch employs an alkaline etch solution, such as tetramethylammonium hydroxide (TMAH) or potassium hydroxide (KOH). Alternatively, an isotropic etch, such as a reactive ion etch (RIE) may be employed. As shown, the grooves are continuous grooves. The grooves may be selectively formed in the LED region of the first major surface of the substrate. For example, a photoresist mask may be used. The mask includes openings to expose the LED region. In other embodiments, the grooves may be discontinuous grooves which are selectively formed under the LED bodies.

Figure 2C:
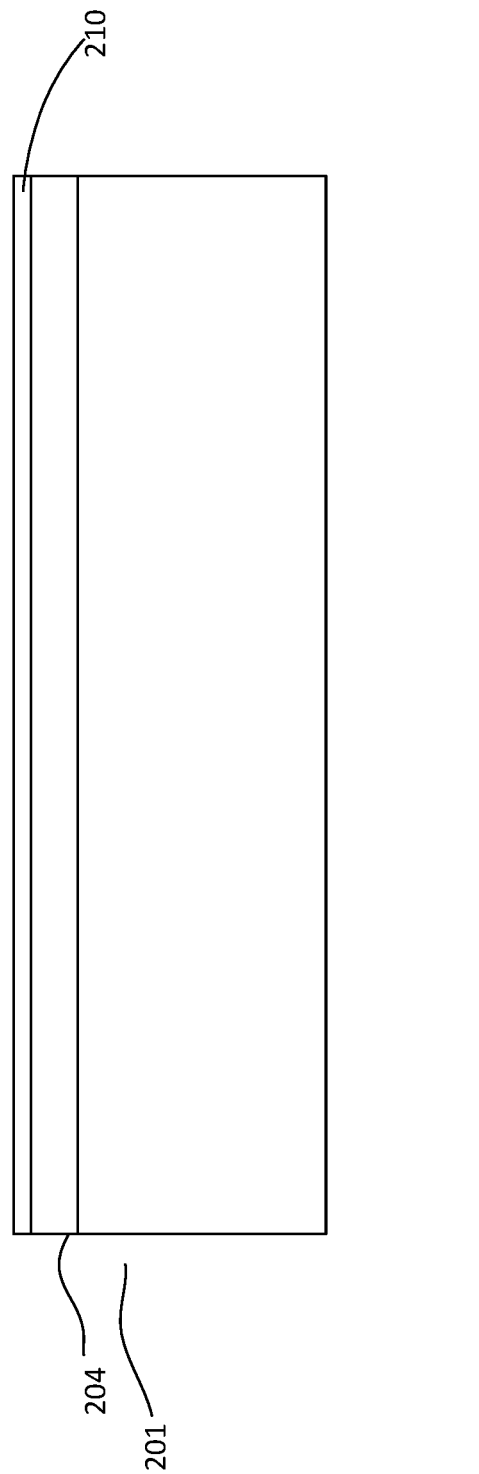

As shown in FIG. 2c, a base layer 210 is formed over the substrate. The base layer may be a composite base layer having multiple layers. In one embodiment, the base layer includes a nucleation layer and a buffer layer. The nucleation layer is disposed on the substrate and the buffer layer is disposed on the nucleation layer. The nucleation layer may be an AlN layer and the buffer layer may be a GaN layer. The layers may be formed by metalorganic chemical vapor deposition (MOCVD) or molecular beam epitaxy (MBE) growth process. Other forming or deposition techniques may also be useful. The thickness of the nucleation layer may be about 50-200 nm while the buffer layer may be about 0.5-2 um. Other thicknesses for the nucleation and buffer layers may also be useful. In the case of grooves on the top surface of the substrate, the base layer may be planarized to form a planar surface. For example, a chemical mechanical polish (CMP) may be performed to form a planar top surface. This results in the second base layer having a planar top surface. Alternatively, the second base layer is planarized to form a planar top surface.

Figure 2D:
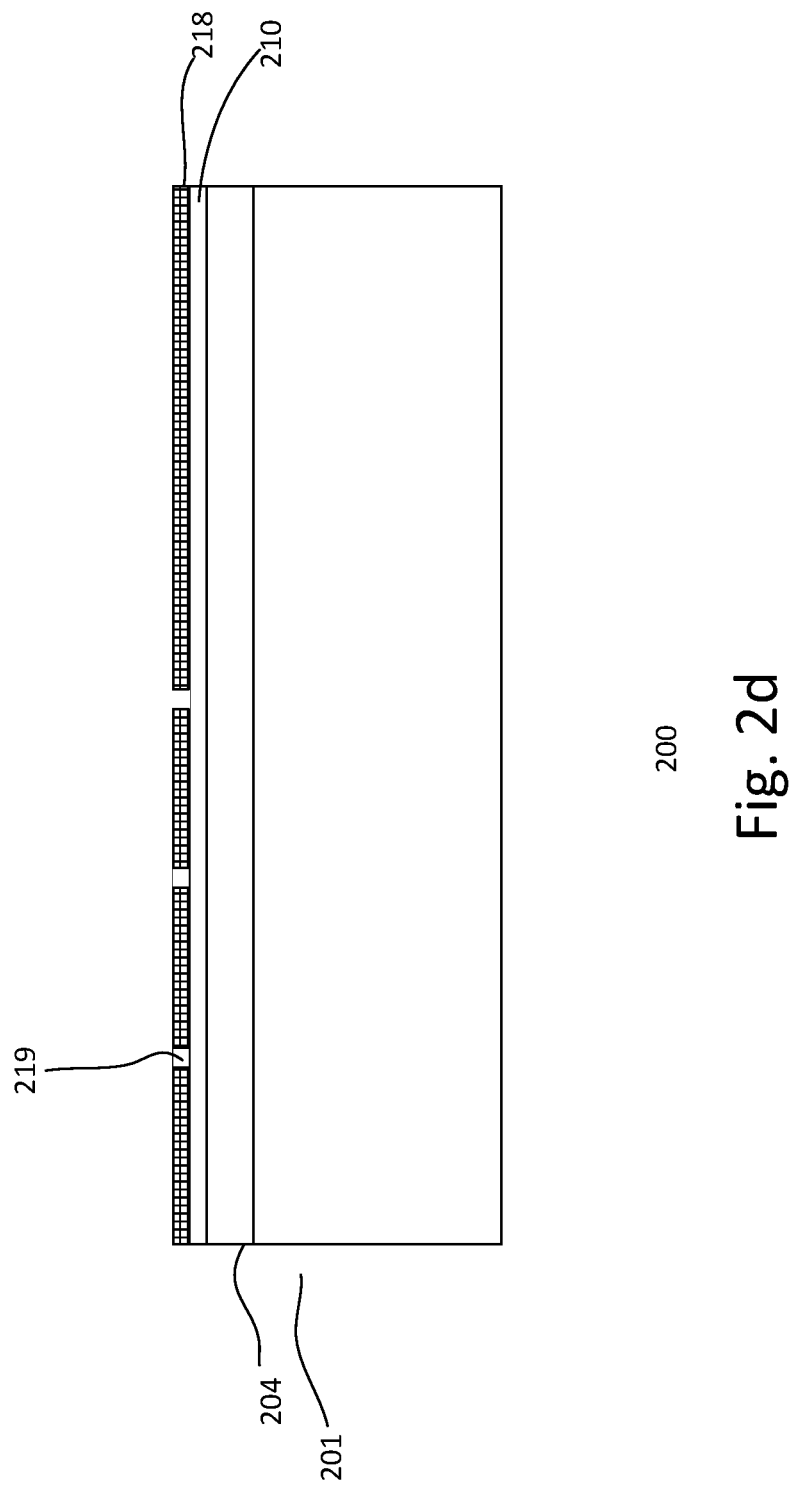

In FIG. 2d, a dielectric mask layer 218 is formed on the substrate. The dielectric mask layer, in one embodiment, is a SiN layer. The mask layer may be formed by, for example, CVD. The mask layer is patterned to form openings 219 corresponding to where a body is to be formed. The body may be a fin body. Alternatively, the body may be a nanowire body.

To pattern the mask layer, mask and etch techniques may be used. For example, a soft mask, such as a photoresist mask, may be formed over the mask layer. An exposure source may selectively expose the photoresist layer through a reticle containing the desired pattern. After selectively exposing the photoresist layer, it is developed to form openings. To improve lithographic resolution, an anti-reflective coating (ARC) may be used below the photoresist layer.

The patterned photoresist layer serves as an etch mask for an etch process. For example, the etch transfers the pattern of the photoresist mask to the mask layer 218. The etch removes the mask layer unprotected by the photoresist mask, exposing the base layer below. The etch, for example, may be an anisotropic etch, such as reactive ion etch (RIE). Other types of etch processes may also be useful. After patterning the mask layer, the photoresist etch mask is removed, for example, by ashing. Other techniques for removing the photoresist mask may also be useful.

Figure 2E:
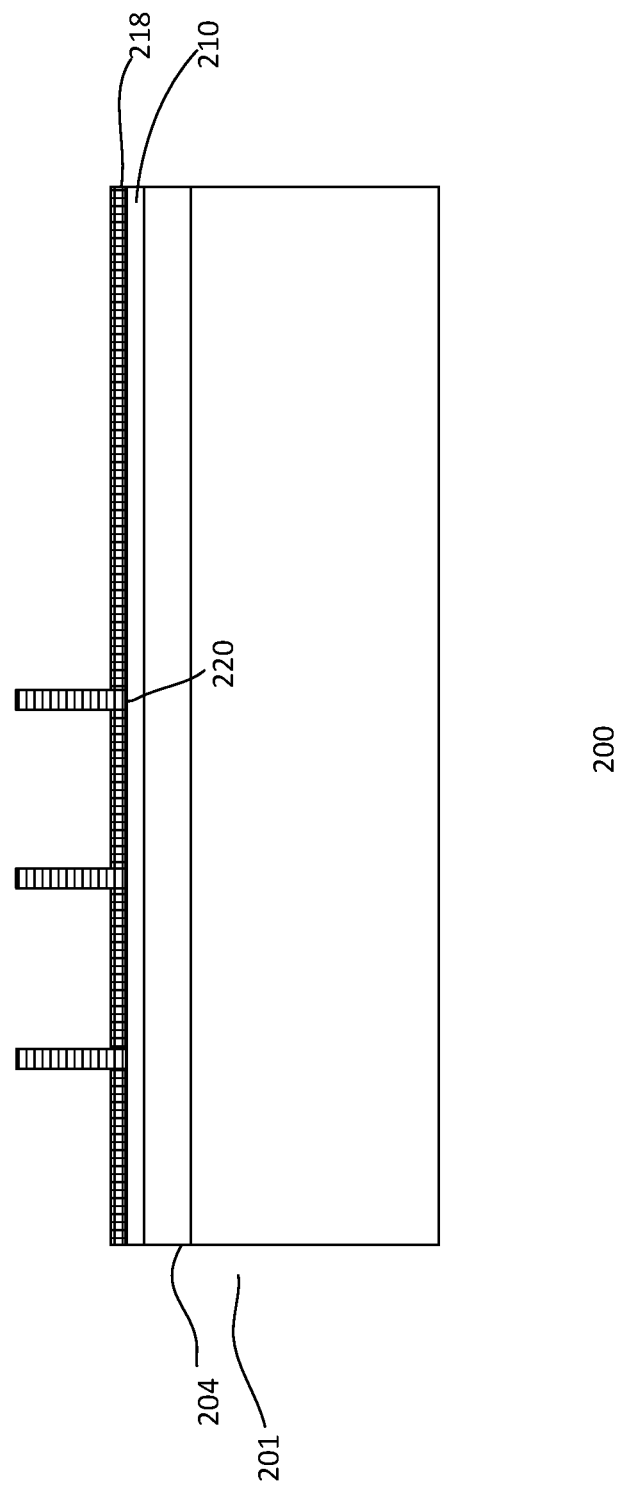

As shown in FIG. 2e, bodies 220 of LEDs are formed on the substrate. In one embodiment, the bodies are formed in the opening in the mask layer 218. The bodies are GaN bodies. The bodies may be formed by SEG. Other techniques for forming the bodies may include MOCVD and MBE. In one embodiment, the bodies are first polarity type doped GaN bodies. In one embodiment, the bodies are n-GaN bodies. Doping the bodies may be achieved by in-situ doping during epitaxial growth or by ion implantation after formation. Although three bodies are shown, it is understood that a device includes many bodies for forming multi-color LED pixels of a display.

As discussed, the bodies or body portions for different color LEDs have different widths. The different body widths may be formed by patterning the mask layer to correspond to the different width bodies or body portions. The different widths facilitate having different percentage of In in the well layers of the MQW. In one embodiment, the width of the body or body portion for the R LED is less than about 100 nm, the width of the body or body portion for the G LED is about 200 nm while the width of the body or body portion of the B LED is greater than about 300 nm. Other widths for different body or body portions may also be useful.

Figure 2F:
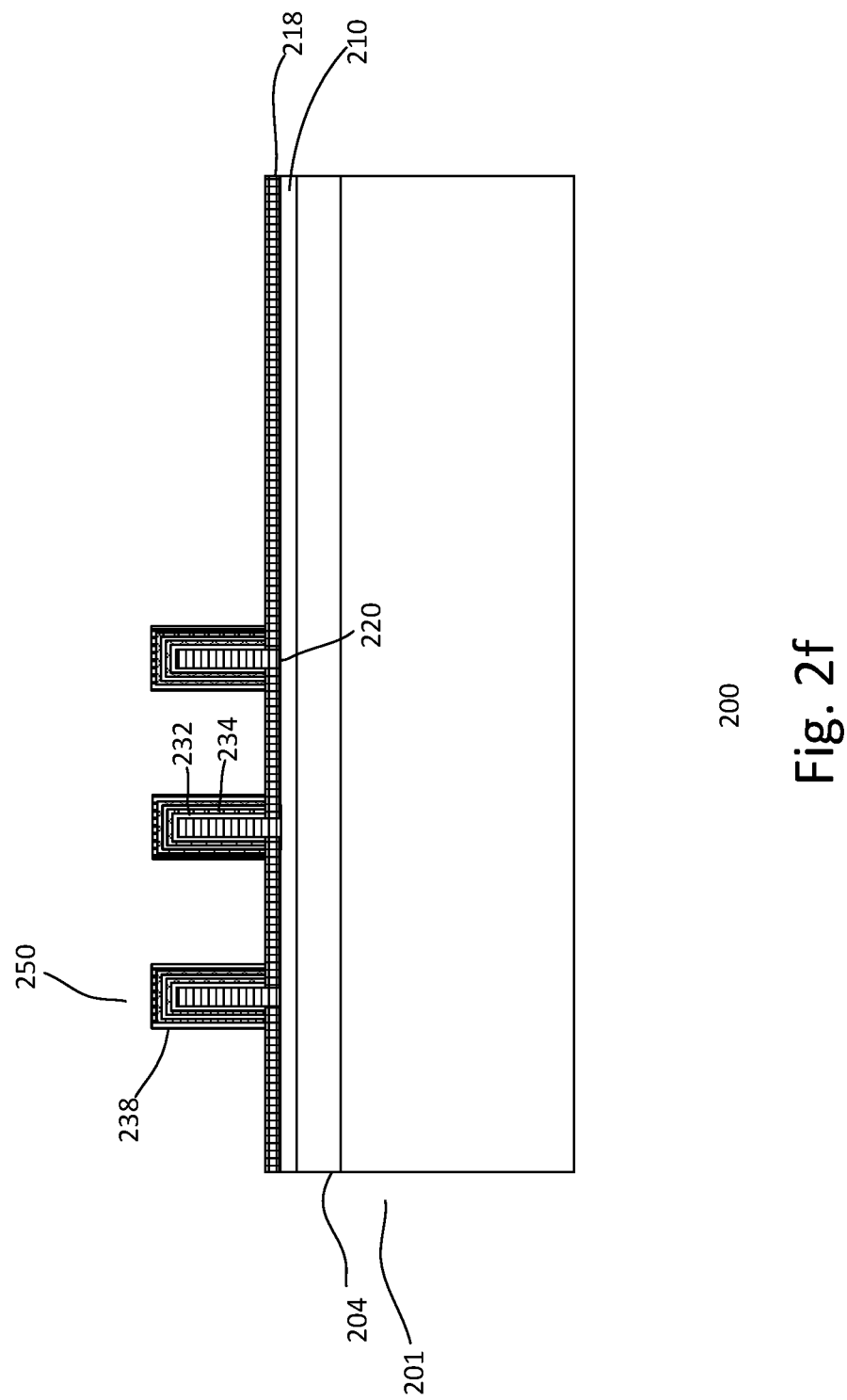

In FIG. 2f, the process proceeds to form MQWs on the bodies. As discussed, a MQW includes a plurality of QWs. For example, a MQW may include 2-6 QWs. Other number of QWs may also be useful. In one embodiment, the MQW includes 2 QWs. As shown, a first well layer 232 is formed over the bodies. A first barrier layer 234 is formed over the first well layer. In one embodiment, the first well layer is an InGaN layer and the first barrier layer is a GaN layer. The body, first well layer and first barrier layer forms a first QW. A second well layer, such as an InGaN and a second barrier layer, such as GaN, are formed over the first QW. The first barrier layer, the second well layer and the second barrier layer serves as the second QW. As such, the MQW includes alternating layers of InGaN and GaN layers disposed over the exposed fin body. The various layers may be formed by SEG, MOCVD, or MBE.

As discussed, the well layer of different color LEDs have different percentages of In to produce different bandgaps. In one embodiment, the percentage of In for the $In_xGa_{1-x}N$ layer in the MQW may be as follows:

Blue: x=15-20%;
Green: x=25-30%; and
Red: x=35-40%.

The different color LEDs 250 are processed separately. The sequence that the different color MQWs are formed depends on the thermal cycle required. In one embodiment, the sequence is from highest required thermal cycle to the lowest required thermal cycle.

In one embodiment, the B MQWs for B LEDs are formed first, the G MQWs for G LEDs are formed after forming the B MQWs and then R MQWs for R LEDs are formed last. Forming the MQWs in separate processes may be achieved using a mask layer, such as silicon oxide. The mask layer is patterned to expose the LED bodies or body portions which are to be processed. After the B, G and R MQWs are formed, a mask layer is formed to seal the MQWs. A polishing process is performed to form a planar top surface. The process repeats to expose the next bodies or body portions for processing the next set of MQWs, forming and polishing a mask layer. The process repeats until all the desired MQWs are formed.

After the MQWs for the different color LEDs are formed, the mask layer is removed to expose the MQWs. Electron blocking layers (not shown), such as AlGaN, are formed on the MQWs. Top LED layers 238 are then formed over the blocking layers. The top LED layers are second polarity doped GaN, such as p-GaN. Doping the top LED layers may be achieved by in-situ doping during SEG or by ion implantation after formation. The top LED layers serve as second terminals of the MQW LEDs. In one embodiment, the blocking and top LED layers may be formed by SEG, MOCVD or MBE.

Figure 2G:
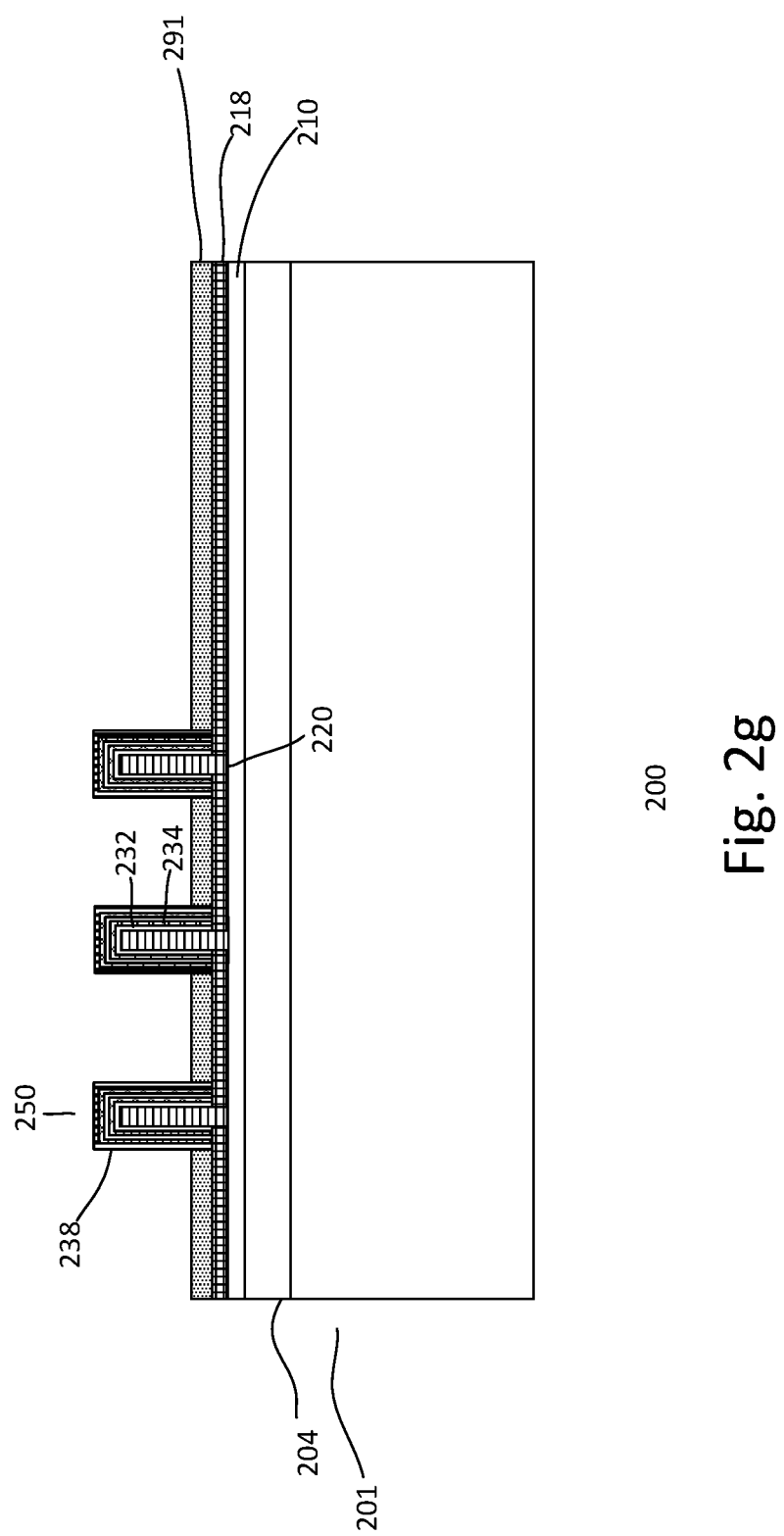

Referring to FIG. 2g, a metal layer 291 is formed on the substrate. The first metal layer represents LM or LM1 of the device. The first metal layer is formed on the mask layer 218. The first metal layer, in one embodiment, is a high temperature metal layer, such as titanium (Ti) or tungsten (W). Other types of conductive materials which can sustain high temperatures, such as less than about 750° C., may also be useful. The metal layer, as shown, is coupled to the top LED layer at sides of the LEDs. The thickness of the metal layer may be about 0.25 um. Other thicknesses may also be useful.

In one embodiment, a metal layer is formed on the substrate. The metal layer may be formed by sputtering. Other techniques for forming the metal layer may also be useful. The metal layer fills the gaps and covers the LED. The metal layer may be recessed to a desired depth by, for example, an etch back process. The metal layer is patterned using, for example, mask and etch techniques to form metal lines or plates for coupling LEDs of a pixel with the same color.

Figure 2H:
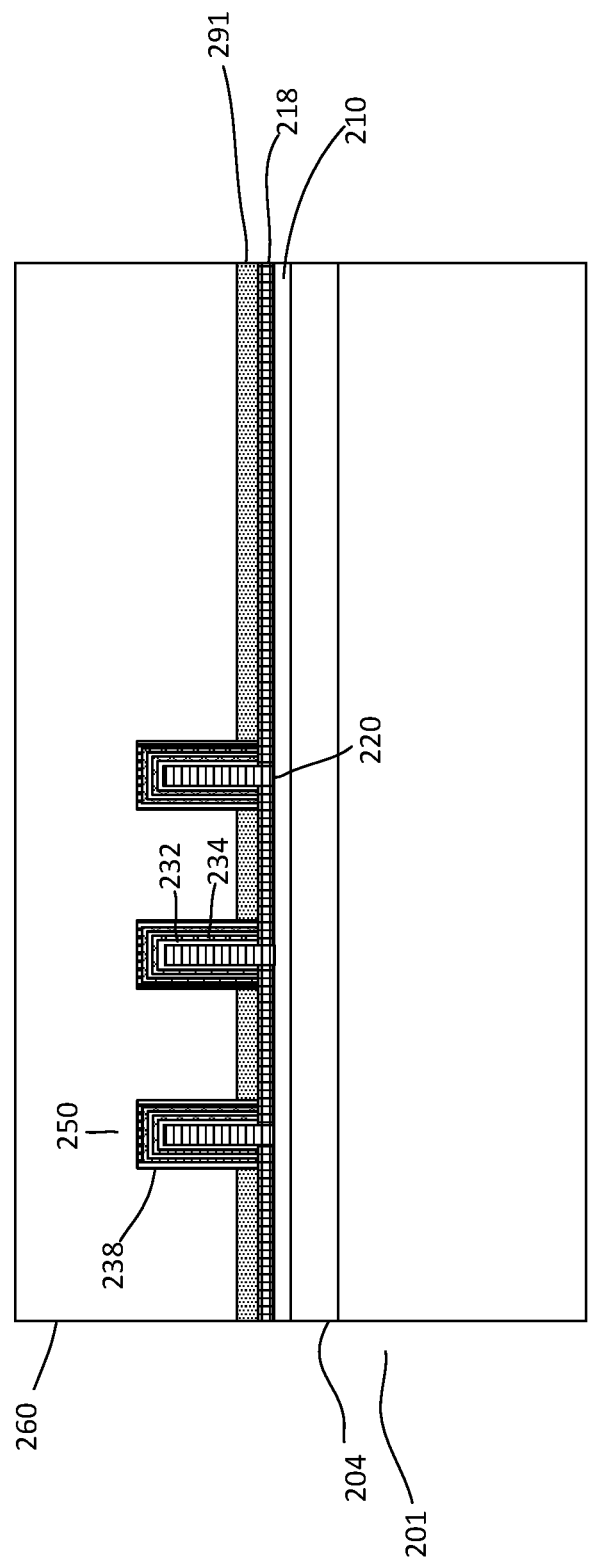

In FIG. 2h, a dielectric layer 260 is formed over the substrate, covering the LEDs and patterned metal layer 291. The dielectric layer may be a silicon oxide layer. Other types of dielectric layers may also be useful. The dielectric layer is formed by, for example, chemical vapor deposition (CVD). Other techniques may also be useful to form the dielectric layer. The dielectric layer fills the gaps and covers the LEDs. A CMP may be performed to form a dielectric layer with a planar top surface above the LEDs.

Figure 2I:
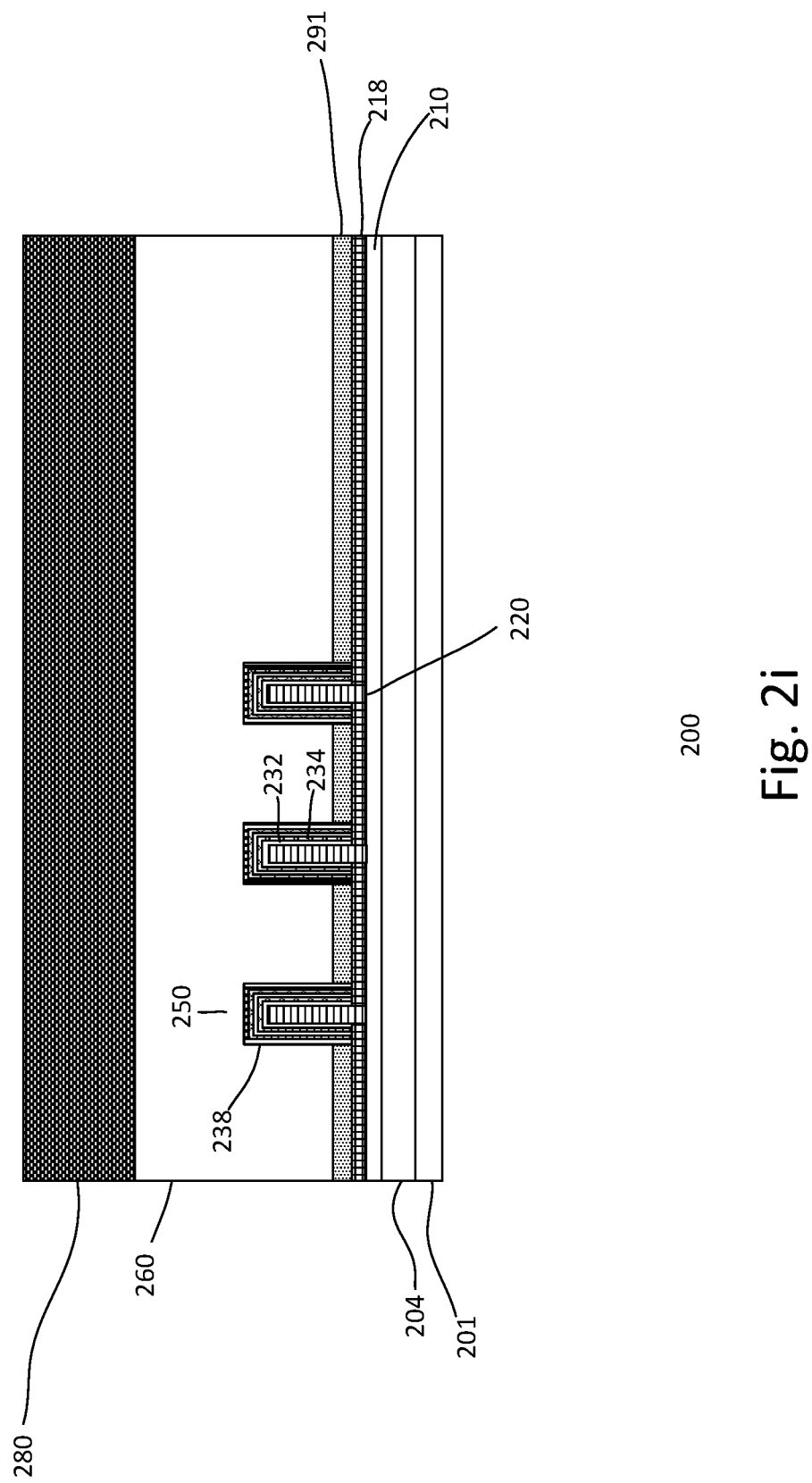

Referring to FIG. 2i, a carrier substrate layer 280 is bonded to the surface of the dielectric layer 260. In one embodiment, the carrier layer may be a silicon wafer. Other types of carrier wafers may also be useful. The carrier substrate may be attached to the dielectric layer using substrate bonding techniques. In one embodiment, the carrier substrate is bonded to the dielectric layer using an oxide-oxide wafer bonding process. For example, an oxide layer is formed on the carrier substrate and bonded to the dielectric layer 260 using oxide-oxide bonding. Other wafer bonding techniques may also be useful.

After bonding the carrier substrate, the second major surface or backside of the substrate 101 is processed to reduce its thickness. In one embodiment, the substrate is thinned by a polishing process, such as CMP. Other thinning processes, such as grinding or etching, may also be used to thin the substrate. The thin substrate may have a thickness of about 10-100 um.

Figure 2J:
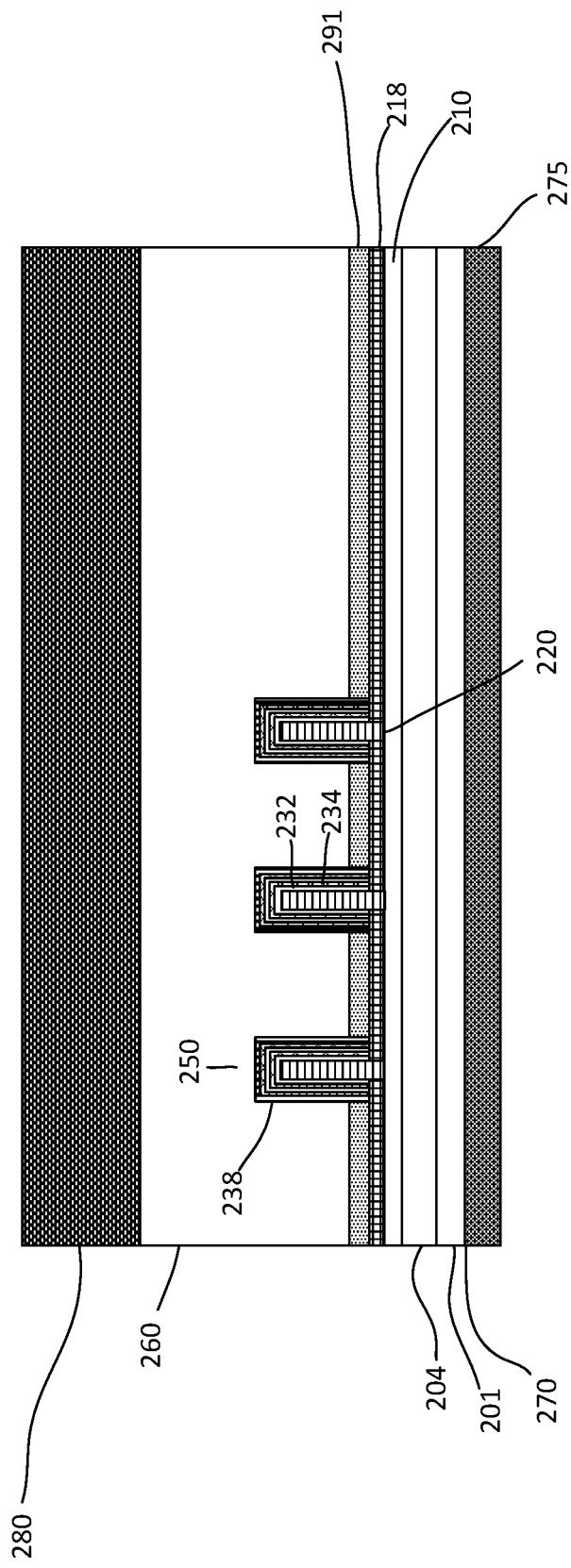

As shown in FIG. 2j, the second major surface of the substrate is processed to form CMOS components 270, such as TFTs. The CMOS components are formed using FEOL processing. In one embodiment, low temperature FEOL processing is performed to form the CMOS components.

In one embodiment, low temperature STIs are formed to define transistor regions on the second surface of the substrate. The process to form STIs includes forming isolation trenches corresponding to STI regions in the second substrate surface. The trenches may be formed by mask and etch techniques. In one embodiment, a hard mask, such as silicon oxide or silicon nitride, is used. The hard mask may be patterned by a photoresist layer which is exposed with an exposure source using a reticle with the desired pattern. The pattern on the resist mask is transferred to the hard mask by an etch, such as RIE. The hard mask is then used to etch the substrate to form the isolation trenches.

An isolation fill layer is deposited on the second substrate surface, filling the isolation trenches. The isolation fill layer is a low temperature oxide layer. The oxide layer, for example, may be a high density plasma (HDP) deposited oxide layer at a temperature of less than about 750° C. The HDP oxide is densified by an anneal. The deposited oxide may be densified by a rapid thermal anneal (RTA). The RTA is performed at less than 750° C. for a short period of time, such as a few 10 s of seconds. Since the RTA is performed for a very short time at less than 750° C., it would not damage the LEDs on the first substrate surface. In other embodiments, the densification process may be a dynamic surface annealing (DSA) or a laser spike annealing (LSA). The DSA or LSA process may reach a maximum temperature of 1,000° C. for a few milliseconds period. The use of DSA or LSA achieves densification with spatially localized effect, avoiding thermal impact on the LEDs.

A polishing process, such as CMP removes excess oxide fill layer and produces a planar top surface with the hard mask layer. In one embodiment, an over-polish may be performed to recess the oxide in the isolation trenches below the hard mask layer but above the second substrate surface. The exposed hard mask layer is removed followed by a clean. The clean, for example, further recesses the oxide fill in the isolation trenches to about the second substrate surface of slightly above the second substrate surface. This forms STIs on the substrate defining transistor or other device regions. Other techniques for forming low temperature STIs may also be useful.

After forming STIs, device wells for the TFTs may be formed. The device wells may include both second and first polarity type wells which serve as bodies of first and second polarity type transistors. For example, the device wells include p-type and n-type device wells which serve as bodies of n-type and p-type transistors. The device wells may be lightly or intermediately doped device wells. Implants using implant masks, such as photoresist masks, may be performed to form the device wells. First and second polarity type wells are formed using separate implant and mask processes. In some cases, there may be different types of same polarity doped wells which are formed using separate implant and mask processes. For example, the wells may have different dopant concentrations. After each implant process, the implant mask is removed. Other configurations for forming the doped wells may also be useful.

In one embodiment, the substrate is annealed to activate the dopants in the device wells. For example, the anneal may be a RTA. Alternatively, the anneal may be a DSA, LSA or far-infrared laser activation. The activation anneal process parameters may be similar to those used in the densification process for the trench isolation material.

The process may continue to form gates of TFTs in the device regions. For example, the process continues to form gate dielectric and gate electrode layers on the second surface of the substrate. The gate dielectric and gate electrode layers may be formed by low temperature processes below 750° C. The gate dielectric layer may be a low temp oxide or a low temp deposited oxide. The gate electrode layer may be a polysilicon layer deposited by using CVD techniques. The gate layers are patterned to form gates. The gate layers may be patterned using mask and etch techniques.

The process may proceed with forming heavily doped S/D regions for the transistors. The S/D regions may be formed by implanting first polarity type dopants for first polarity type transistors and second polarity type dopants for second polarity type transistors. The S/D region may include lightly doped (LD) extension regions. The S/D regions may be displaced from the gate while the LD extension regions extend from the S/D regions to under the gate. To facilitate forming S/D and LD regions, dielectric spacers may be formed on the sidewalls of the gate. For example, LD implants form LD extension regions for first and second polarity type transistors. Spacers are formed on sidewalls following by S/D implants to form S/D regions for first and second polarity type transistors. Separate implants are performed to form the first and second polarity type LD extension regions and first and second polarity type doped regions. Forming S/D contacts may also include forming well contacts to the device wells. For example, the S/D implants also form well contacts.

In some embodiments, elevated S/D regions are formed. Elevated S/D regions include forming epitaxial layers on the substrate over the S/D regions. The epitaxial layers may be formed by SEG. The epitaxial layers may be silicon (Si) or silicon germanium (SiGe) epitaxial layers. The epitaxial S/D layers are formed after forming spacers. For Si epitaxial layers, they are formed at less than 750° C. while SiGe epitaxial layers are formed at less than 650° C. The raised S/D regions may be doped by in-situ doping or by ion implantation after formation.

After forming the S/D regions, dopant activation is performed. The S/D dopants may be activated by an anneal. In one embodiment, the dopant activation includes LSA, DSA or far-infrared laser activation. For example, the parameters to activate the S/D dopants may be similar to that for activating the dopants of the doped wells.

Metal silicide contacts, such as nickel-based silicide contacts may be formed on the contact regions on the substrate. The contact regions include S/D regions, gate electrodes and well contacts. To form the metal silicide layer, a metal layer is formed on the substrate. The metal layer is annealed to cause a reaction with exposed silicon surface of the substrate. The anneal, in one embodiment, may include LSA, DSA or far-infrared laser anneal. Annealing may be performed at a temperature of less than 700° C. This forms metal silicide contacts. Unreacted metal is removed by, for example, a wet etch, leaving metal silicide contacts on the contact regions.

As described, the FEOL processes to form CMOS components are effectively performed at less than 750° C. For example, some processes may be performed at a higher temperature, but are localized to the second substrate surface and do not affect the first substrate surface with the LEDs.

Back-end-of-line (BEOL) process is performed. The BEOL process includes forming a BEOL dielectric 275 on the second major surface of the substrate. The BEOL dielectric covers the FEOL components. The BEOL dielectric includes a plurality of interlevel dielectric (ILD) layers. An ILD layer includes a contact level with via contacts and metal level with metal lines. An ILD layer may be formed using various processes. For example, single damascene, dual damascene, and/or reactive ion etch techniques may be employed. Other techniques may also be employed to form ILD layers of the BEOL dielectric. The contacts may be W or copper contacts while the metal lines may be copper lines. Other types of contacts and metal lines may also be useful. Other types of BEOL dielectrics may also be included in the BEOL dielectric. The BEOL dielectric may include about 3-8 ILD layers. Providing a BEOL with other number of ILD layers may also be useful. The top ILD layer may serve as a pad layer to provide metal pads for external connections to the device.

Figure 2K:
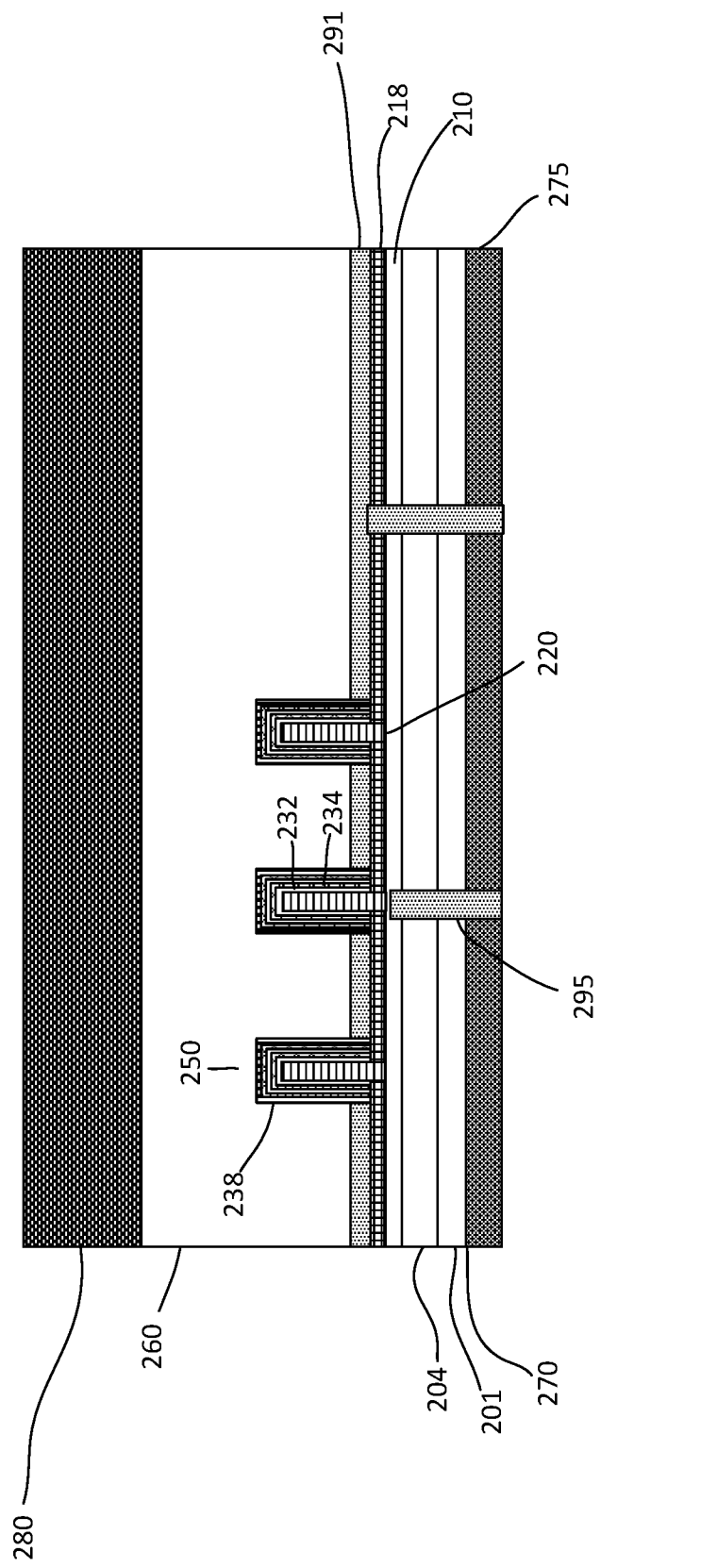
Figure 2I:
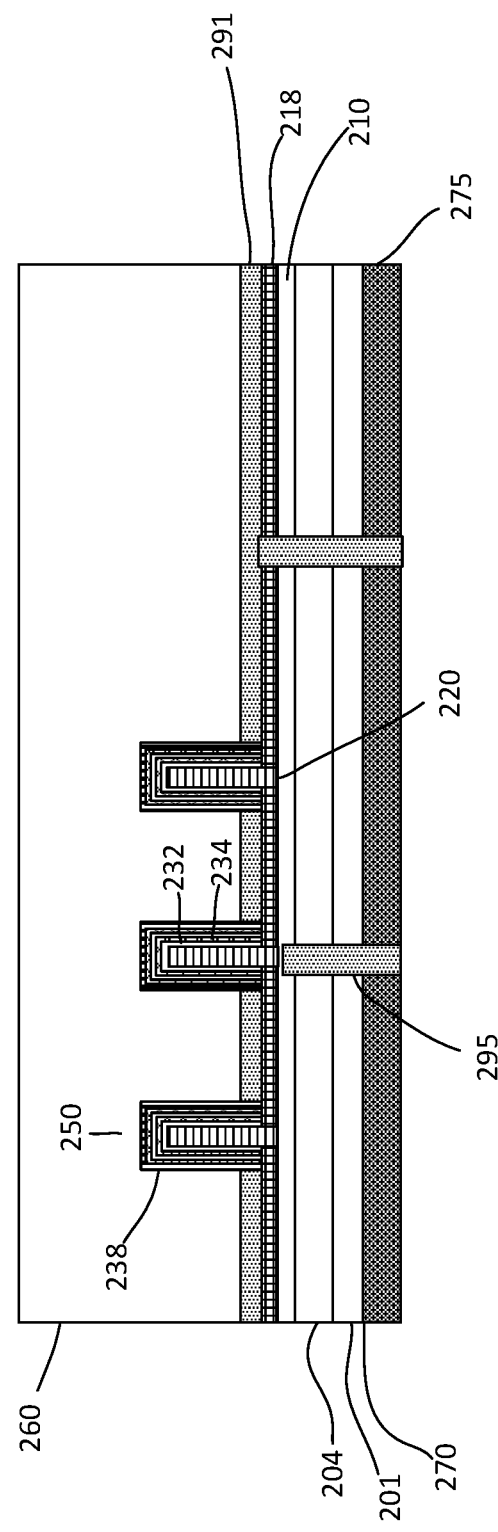

In FIG. 2k, the process forms TSV contacts 295. The TSV contacts include forming TSV openings through the BEOL dielectric and substrate. The TSV opening may be formed using mask and etch techniques. For example, a ME is performed using an etch mask to form TSV openings though the BEOL dielectric and substrate. In one embodiment, processes are employed to form first TSV openings and second TSV openings. The first TSV openings extends to the first LED terminals (base layer 210) while the second TSV openings extend to the second LED terminals (metal lines 291). After forming the TSV openings, a dielectric layer, such as silicon oxide, may be formed to line the TSV openings. An anisotropic etch, such as RIE, is performed to remove the dielectric layer from the bottom of TSV openings. A conductive material, such as copper, fills the TSV openings, forming TSV contacts. A planarization process, such as CMP, removes excess conductive materials, forming TSV contacts. The TSV contacts are coupled to LED terminals of LEDs on the first substrate surface.

A redistribution layer (RDL) may be formed on the BEOL dielectric to provide connections between TSV contacts and CMOS components on the second substrate surface. The RDL also provides external pad connections to the device.

Referring to FIG. 2*l*, the carrier substrate 280 is removed. The dielectric layer 260 may subsequently be removed. A passivation layer may be formed over the LEDs. Other processes may also be performed to complete the device.

The present disclosure may be embodied in other specific forms without departing from the spirit or essential characteristics thereof. The foregoing embodiments, therefore, are to be considered in all respects illustrative rather than limiting the invention described herein. The scope of the disclosure is thus indicated by the appended claims, rather than by the foregoing description, and all changes that come within the meaning and range of equivalency of the claims are intended to be embraced therein.

The invention claimed is:

1. A device comprising:
a substrate having first and second major substrate surfaces;
the first substrate surface comprises multiple quantum well (MQW) LEDs configured to form a multi-color LED display, wherein a MQW LED includes a first LED terminal and a second LED terminal;
complementary metal oxide semiconductor (CMOS) components disposed on the second substrate surface, wherein the CMOS components comprise low temperature CMOS components which avoid damaging the MQW LEDs on the first substrate surface;
CMOS back-end-of-line (BEOL) dielectric with a plurality of interlevel dielectric (ILD) layers to provide interconnections to the CMOS components; and
through silicon via (TSV) contacts which extend through the back surface of the substrate, wherein the TSV contacts
interconnect the CMOS components on the second substrate surface CMOS components to LED terminals on the first surface of the substrate, and
interconnect the external pad connections on the surface of the BEOL dielectric.

2. The device of claim 1 wherein the MQW LEDs comprise:
red (R) MQW LEDs;
green (G) MQW LEDs;
blue (B) MQW LEDs; and
wherein the R MQW LEDs, G MQW LEDs and B MQW LEDs are configured into a plurality of RGB pixels of the LED display.

3. The device of claim 2 wherein:
a MQW LED includes an LED body, the LED body serves as a first terminal of the MQW LED;
a MQW having alternating well and barrier layers, wherein a well layer comprises $In_xGa_{1-x}N$; and
a top LED layer, the top LED layer serving as the second terminal of the MQW LED;
wherein a RGB pixel includes a red (R) MQW LED, a green (G) MQW LED and a blue (B) MQW LED, wherein the MQW LED includes an anode terminal and a cathode terminal.

4. The device of claim 3 wherein
the R LEDs each includes a R MQW;
the G LEDs each includes a G MQW;
the B LEDs each includes a B MQW; and
wherein the R MQW, the G MQW and the B MQW comprise different bandgaps for emitting R, G and B light.

5. The device of claim 4 wherein the different bandgaps of the R MQW, the G MQW and B MQW are achieved by varying a percentage x of In in the well layers, wherein
the percentage x of In of the $In_xGa_{1-x}N$ well layer of the R MQW is about 35-45%;
the percentage x of In of the $In_xGa_{1-x}N$ well layer of the G MQW is about 25-30%; and
the percentage x of In of the $In_xGa_{1-x}N$ well layer of the B MQW is about 15-20%.

6. The device of claim 3 wherein the MQW LEDs comprise fin-type MQW LEDs, wherein a fin-type LED comprises a fin LED body.

7. The device of claim 3 wherein the MQW LEDs comprise nanowire MQW LEDs, wherein a nanowire LED comprises a nanowire body.

8. The device of claim 1 wherein the low temperature CMOS components comprise thin film transistors.

9. The device of claim 1 wherein the CMOS components are configured to form circuitry to control the LEDs of the display.

10. The device of claim 1 wherein each TSV contact comprises a conductive contact surrounded by a dielectric collar.

11. The device of claim 1 wherein:
a first common terminal of the LEDs is disposed in an LED base layer above the first surface of the substrate;
second terminals of the LEDs are disposed in a metal level above the first common terminal of the LEDs; and
the TSV contacts comprise first and second TSV contacts, wherein
the first TSV contacts extend through the first substrate surface to the first common terminal of the LEDs, and
the second TSV contacts extend through the first substrate surface to the second terminals of the LEDs above the first common terminal.

12. A method of forming a device comprising:
providing a substrate, the substrate comprises first and second opposing major surfaces;
forming MQW LEDs on the first major surface of the substrate, the MQW LEDs are configured as a multi-color LED display;
forming CMOS components on the second major surface of the substrate using front-end-of-line (FEOL) processing;
forming back-end-of-line (BEOL) dielectric over the CMOS components using BEOL processing, the BEOL dielectric includes a plurality of interlevel dielectric (ILD) levels, wherein an ILD level comprises
a via dielectric layer with contacts,
a metal dielectric layer with metal lines, and wherein the BEOL dielectric provides interconnections for the CMOS components;
forming through silicon via TSV contacts, the TSV contacts extend through the second substrate surface and connect to the LED terminals of the LED on the first substrate surface, wherein the TSV contacts provide interconnections between the CMOS components and LEDs.

13. The method of claim 12 wherein forming the MQW LEDs comprise:
  forming red (R) MQW LEDs;
  forming green (G) MQW LEDs;
  forming blue (B) MQW LEDs; and
  wherein the R MQW LEDs, G MQW LEDs and B MQW LEDs are configured into a plurality of RGB pixels of the LED display.

14. The method of claim 13 wherein:
  a MQW LED includes an LED body, the LED body serves as a first terminal of the MQW LED;
  a MQW having alternating well and barrier layers, wherein a well layer comprises $In_xGa_{1-x}N$ ; and
  a top LED layer, the top LED layer serving as the second terminal of the MQW LED. wherein a RGB pixel includes a red (R) MQW LED, a green (G) MQW LED and a blue (B) MQW LED, wherein the MQW LED includes an anode terminal and a cathode terminal.

15. The method of claim 14 wherein
  the R LEDs each includes a R MQW;
  the G LEDs each includes a G MQW;
  the B LEDs each includes a B MQW; and
  wherein the R MQW, the G MQW and the B MQW comprise different bandgaps for emitting R, G and B light.

16. The method of claim 15 wherein the different bandgaps of the R MQW, the G MQW and B MQW are achieved by varying a percentage x of In in the well layers, wherein
  the percentage x of In of the $In_xGa_{1-x}N$ well layer of the R MQW is about 35-45%;
  the percentage x of In of the $In_xGa_{1-x}N$ well layer of the G MQW is about 25-30%; and
  the percentage x of In of the $In_xGa_{1-x}N$ well layer of the B MQW is about 15-20%.

17. The method of claim 14 wherein forming the MQW LEDs comprises forming fin-type MQW LEDs, wherein a fin-type LED comprises a fin LED body.

18. The method of claim 14 wherein forming the MQW LEDs comprises forming nanowire MQW LEDs, wherein a nanowire LED comprises a nanowire body.

19. The method of claim 12 wherein forming the CMOS components comprises forming thin film transistors.

20. The method of claim 12 wherein each TSV contact comprises a conductive contact surrounded by a dielectric collar.

* * * * *